United States Patent [19]

Dingle et al.

[11] 4,205,329
[45] May 27, 1980

[54] PERIODIC MONOLAYER SEMICONDUCTOR STRUCTURES GROWN BY MOLECULAR BEAM EPITAXY

[75] Inventors: Raymond Dingle, Summit; Arthur C. Gossard, Warren; Pierre M. Petroff, Westfield; William Wiegmann, Middlesex, all of N.J.

[73] Assignee: Bell Telephone Laboratories, Incorporated, Murray Hill, N.J.

[21] Appl. No.: 852,845

[22] Filed: Nov. 18, 1977

Related U.S. Application Data

[63] Continuation-in-part of Ser. No. 671,565, Mar. 29, 1976, abandoned.

[51] Int. Cl.² .................................................. H01L 29/26
[52] U.S. Cl. ...................................... 357/16; 148/175; 357/4; 357/18; 331/94.5 H
[58] Field of Search ................................ 357/4, 16, 18

[56] References Cited

U.S. PATENT DOCUMENTS

| | | | |
|---|---|---|---|
| 3,309,553 | 3/1967 | Kroemer | 357/18 |
| 3,691,476 | 9/1972 | Hayashi | 357/18 |
| 3,737,737 | 6/1973 | Heywang et al. | 357/18 |
| 3,872,400 | 3/1975 | Glausecker et al. | 357/16 |
| 3,893,148 | 7/1975 | Madjid | 357/16 |
| 3,915,765 | 10/1975 | Cho et al. | 357/18 |
| 3,929,527 | 12/1975 | Chang et al. | 357/16 |
| 3,980,883 | 9/1976 | Franks | 250/272 |
| 3,982,207 | 9/1976 | Dingle et al. | 357/16 |

OTHER PUBLICATIONS

Miljagin et al., Sov. Phys. Crystallog., vol. 20, No. 3, 1975, pp. 379-381.
Cho, Appl. Phys. Letters, vol. 19, No. 11, Dec. 1971, pp. 467-468.
Chang et al., Applied Physics Letters, vol. 28, No. 1, pp. 39-41, (Jan. 1, 1976).
Ludke et al., Appl. Phys. Letters, vol. 24, No. 9, pp. 417-419, (May 1, 1974).

*Primary Examiner*—William D. Larkins
*Attorney, Agent, or Firm*—Michael J. Urbano

[57] ABSTRACT

Suitably modified molecular beam epitaxy (MBE) techniques are used to synthesize single crystal, periodic monolayer superlattices of semiconductor alloys on single crystal substrates maintained below a critical growth temperature. Described is the fabrication of periodic structures of $(GaAs)_n(AlAs)_m$, where m and n are the number of contiguous monolayers of GaAs and AlAs, respectively, in each period of the structure. As many as 10,000 monolayers were grown in a single structure. Also described is the MBE growth of $(Al_xGa_{1-x}As)_n(Ge_2)_m$, quasi-superlattice and non-superlattice structures depending on the particular values of n, m and the growth temperature. Waveguides, heterostructure lasers and X-ray reflectors using some of the structures are also described.

15 Claims, 7 Drawing Figures

PERIODIC MONOLAYER SEMICONDUCTOR STRUCTURES GROWN BY MOLECULAR BEAM EPITAXY

CROSS REFERENCE TO RELATED APPLICATION

This application is a continuation-in-part of my copending application, Ser. No. 671,565, filed Mar. 29, 1976 now abandoned.

BACKGROUND OF THE INVENTION

This invention relates to the fabrication of periodic semiconductor structures by molecular beam epitaxy (MBE).

In recent years considerable attention has been given to the proposal of Esaki and Tsu (*IBM J. Res. Develop.*, Vol. 14, p. 61, 1970) that new quantum-mechanical effects in electrical properties can be realized in a structure having a one-dimensional periodic potential ("superlattice") formed by a periodic variation of alloy composition or of impurity density with a period of the order of a few hundred Angstroms (i.e., less than the electron mean free path). The experimental work of Ludeke et al typifies the state of the art of this relatively new technology. They report (*Appl. Phys. Let*, Vol 24, No. 9, 1974) the use of MBE to fabricate a 16½ period superlattice in which each period consists of a 50 Angstrom layer of GaAs and a 50 Angstrom layer of $Ga_{0.75}Al_{0.25}As$ on (100) GaAs substrates held at a temperature between 520 and 600 degrees C. during deposition.

Quantum-mechanical effects in such superlattices have been investigated by Esaki et al in earlier work, tunneling experiments, in which negative resistance was observed. More recently Dingle and Henry (U.S. Pat. No. 3,982,207 issued on Sept. 21, 1976) have proposed a tunable, low threshold double heterostructure (DH) laser in which the active region is a modified superlattice.

What has not been done heretofore, however, is to fabricate a superlattice in which each half period is made up of as little as a single monolayer; that is, a layer which has a thickness equal to a single layer of the compound or element making up the layer. In the GaAs (or AlAs) system, for example, such a monolayer is about 2.8 Angstroms thick and comprises a sheet of Ga (or Al) atoms 1.4 Angstroms thick contiguous with a sheet of As atoms, also 1.4 Angstroms thick. On the other hand, for Ge, a monolayer is a single sheet of Ge atoms about 1.4 Angstroms thick. In fact, the state of the art to date is typified by a paper by A. Y. Cho (*Appl. Phy. Let*, Vol. 19, p. 467, 1971) which discloses the fabrication of a periodic structure of alternating layers of GaAs and $Al_xGa_{1-x}As$ each 1700 Angstroms thick and numerous patents by Cho (e.g., U.S. Pat. No. 3,915,765) which state that MBE can be utilized to grow layers having a wide range of thicknesses; for example, 3 Angstroms (a single monolayer) to 100,000 Angstroms. But single monolayer growth in the Cho patents deals only with a single, isolated layer grown on a substrate. In view of the non-equilibrium nature of the MBE crystal growth process, it is not at all obvious that contiguous monolayers of different materials can be deposited with long range ordering; i.e., over distances large relative to the layer thickness. Nor is it clear what physical phenomena, such as inter-layer diffusion or surface-roughening, will inhibit or even prevent such ordering and under what growth conditions, if any, the adverse effects of such phenomena can be alleviated and ordering achieved.

SUMMARY OF THE INVENTION

We have used suitably modified MBE techniques to fabricate superlattices made up of as many as 10,000 alternate monolayers of GaAs and AlAs on GaAs substrates. Transmission electron diffraction (TED) studies of these samples revealed a critical growth temperature for growth of contiguous monolayers. Below this temperature growth occurred in a nearly atomically smooth layer mode, while above this temperature, growth was rough on an atomic scale and obliterated the monolayer structure. The critical temperature, as well as the perfection of the monolayer structure, were found to also depend on crystal orientation. We believe that this experimental work represents the first realization of single crystal alternate monolayer synthetic material with good crystalline quality and long range ordering.

We have, in addition, used the same MBE system to deposit alternate monolayers of $Al_xGa_{1-x}As$ and $Ge_2$ but found that superlattice-like structures were formed only when growth occurred below a critical temperature and only for specific combinations of the number of monolayers of each constituent.

For convenience we have adopted the following nomenclature to designate various forms of superlattices made up of monolayers of GaAs and AlAs: $(GaAs)_n(AlAs)_m$ means that each period of the superlattice comprises n contiguous monolayers of GaAs adjacent to m contiguous monolayers of AlAs. In general, a monolayer superlattice comprises $(A)_n(B)_m$, where A and B are different materials or are the same materials with different doping. In addition, the thicknesses of the sub-lattices $(A)_n$ and $(B)_m$ are critical if the chemistry and physics of the superlattice are to be substantially different from merely forming a heterojunction between different bandgap materials A and B or forming random (homogeneous) alloys of similar materials. In particular, in each sub-lattice of each period of a monolayer superlattice each molecular plane should either be at an interface with an adjacent sub-lattice or no more than one molecular plane removed from such an interface. This condition translates into the following limitation on the parameters m and n: n+m must be no greater than about 4 (taking in account that fractions of a monolayer are possible, although not preferred.) This condition also means that the maximum thickness of either sub-lattice should be no greater than about $3t_o$, where $t_o$ is the monolayer thickness. Thus, the permissible values of n and m include (1,1), (1,2), (1,3), (2,2), (2,1) and (3,1).

In this nomenclature the 10,000 monolayer structure alluded to above would be designated $(GaAs)_1(AlAs)_1$. We have also fabricated superlattices with $1 \leq n \leq 9$ and $1 \leq m \leq 5$; for example $(GaAs)_2(AlAs)_2$ which defines a period comprising two contiguous monolayers of GaAs (5.6 Angstroms) and two contiguous monolayers of AlAs (5.6 Angstroms).

Note, however, that the subscripts m and n need not be equal. Nor need m and n be integers although preferably they should be. Thus, we have fabricated $(GaAs)_n(AlAs)_m$ with $n=6.13\pm0.29$ and $m=3.37\pm0.41$. The fact that m and n need not be integers gives rise to the concept of a fraction of a monolayer. Of course, since a monolayer is by definition a layer or plane of single atoms, it is as thin as physically possible. So, a fraction of a monolayer refers not to thickness but to area or surface coverage. Thus, if in depositing a single layer of atoms, the atoms adhere to only eighty percent of the growth surface, then eight tenths of a monolayer has been deposited.

$(GaAs)_n(AlAs)_m$ monolayer superlattices grown by MBE as described above have a number of interesting properties and uses. We have found that such structures can be used as waveguide cladding to confine light, and therefore find application in a number of DH junction lasers. In addition, because the thicknesses of the layers of the superlattice can be varied on the scale of atomic dimensions, the structure can be used as a broadband x-ray reflector.

In addition, monolayer superlattices of $(GaAs)_n(AlAs)_m$ may be preferred over the corresponding ternary alloy $Al_xGa_{1-x}As$. For example, undesirable clustering of Ga and Al in ternary alloys may be avoided and strains may be modified and made more regular.

As mentioned previously, we have also used modified MBE to fabricate superlattice-like structures of $(Al_xGa_{1-x}As)_n(Ge_2)_m$ $(0 \leq x \leq 1)$ depending on the growth temperature and the particular values of n and m. For reasons as yet unknown, however, when $Al_xGa_{1-x}As$ monolayers are deposited on Ge monolayers, the former tend to exhibit island growth; that is, rather than cover the Ge layer completely, the $Al_xGa_{1-x}As$ layer tends to nucleate locally so that stacks or islands of $Al_xGa_{1-x}As$ grow. Depending on n and m the Ge monolayers can fill in the gaps between islands and cover the islands completely so that a superlattice-like structure results. If not, columnar growth occurs and the resulting structure exhibits pipes or columns of $Al_xGa_{1-x}As$ which extend essentially vertically through the Ge layers. In either case, however, a new synthetic material results; i.e., a material having an absorption edge between that of a $Al_xGa_{1-x}As$ random alloy and that of bulk Ge.

With other growth techniques Ge is not miscible in GaAs (or AlGaAs) beyond ordinary doping levels; (i.e., typically a maximum of about $10^{19}$ Ge atoms cm$^{-3}$ can be doped into $10^{22}$ cm$^{-3}$ (Avogadro's number) of GaAs, or only one Ge atom for every 1000 of GaAs. This corresponds to 0.1% Ge. In contrast, we have achieved new synthetic materials with as much as 50% Ge (e.g., n=m=10) and 90% Ge (n=1, m=10).

$(Al_xGa_{1-x}As)_n(Ge_2)_m$ may be particularly attractive for use as the active region of a heterostructure junction laser because its bandedge (about 1.2 ev or 1 μm) corresponds to an optical transmission window of silica fibers.

BRIEF DESCRIPTION OF THE DRAWING

Our invention together with its various features and advantages, can be readily understood from the following more detailed description taken in conjunction with the accompanying drawing (not drawn to scale) in which.

DETAILED DESCRIPTION

General Technique

Figure 1:
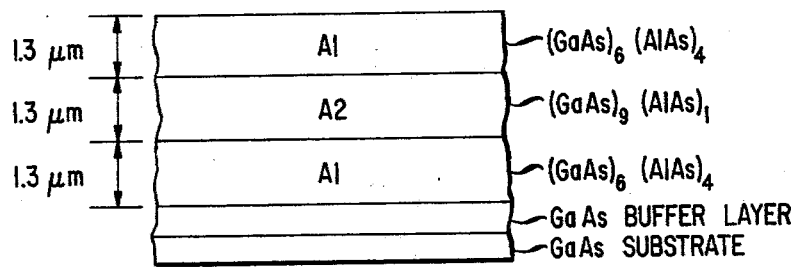
FIG. 1 is schematic of an optical waveguide made up of monolayer superlattices in accordance with one embodiment of our invention.

Monolayer superlattices in accordance with our invention were fabricated by sequential epitaxial molecular beam depositions using the general MBE techniques described by Cho and Arthur in *Progress in Solid State Chemistry*, edited by G. Somerjai and J. McCaldin (Pergamon Press, New York, 1975) Vol. 10, p. 157.

This type of crystal growth on a low index substrate, where atomic steps are absent, takes place by two-dimensional nucleation of new atomic layers. The addition of new material to the crystal occurs either by formation of new nuclei on top of existing ones (island growth) or by lateral growth of the already existing nuclei (layer growth). An intermediate growth regime referred to as island-layer growth may also occur.

The study of the crystal growth process on an atomic scale thus requires some technique for following the formation and sizes of the new atomic layers as they are incorporated into the film being deposited. This was achieved in the following manner. First, a periodic superlattice structure of two constituents which grow epitaxially (e.g., AlAs and GaAs) was introduced into the film by MBE deposition on a single crystal substrate [e.g., (100) or (110) GaAs]. Then, the periodicity in this superlattice, its degree of ordering and its composition were probed by transmission electron microscopy (TEM). These parameters formed a record of the process by which the crystal grew, and enabled us to distinguish between an island growth and a layer growth mode (for islands $\gtrsim$15-20 Angstroms). Electronic properties were probed by photoluminescence and optical absorption.

The general MBE technique for fabricating either $(GaAs)_n(AlAs)_m$ or $(Al_xGa_{1-x}As)_n(Ge_2)_m$ entailed the following standard steps: (1) obtaining a GaAs substrate from commercial sources; (2) cleaning a major surface of the substrate using standard preparation procedures; (3) placing the substrate in an evacuable metal chamber; (4) reducing the chamber pressure to less than $10^{-8}$ torr; (5) loading shuttered effusion cells (ovens) with the requisite source materials for growth; (6) heating the substrate to about 600 degrees C. to cause desorption of contaminants from the growth surface and then adjusting the substrate temperature to that desired for growth; (7) with the shutters closed, heating the ovens until the source materials vaporize; (8) opening selected shutters to effect growth until the desired layer thickness was attained; and (9) maintaining an excess of arsenic at the growth surface during deposition. In addition, we modified the MBE apparatus in two respects. First, the standard cylindrical liquid nitrogen cooling shroud surrounding pairs of ovens was replaced with one having a honeycombed structure. Each oven was placed in a separate opening in the shroud. We found that this structure greatly reduced contamination in the system. Second, instead of individual shutters for each oven we placed one or two rotatable discs in front of the ovens. The discs had annular apertures so that upon rotation selected ones of the ovens would be unblocked (e.g., Ga) while others would be blocked (e.g., Al). In this manner, the length of time that the shutter was open could be made to be about one second by controlling the speed of rotation of the disc and the size of the disc apertures.

In the fabrication of $(GaAs)_n(AlAs)_m$ monolayer superlattices, ovens containing As, Al, and Ga were used as beam sources, while (100) and (110) oriented GaAs wafers were used as substrates for the growth. Growth rates were about 1 monolayer/sec with several tenths of a second of interval between Ga and Al beam periods.

In effect, the fabrication process can be described as forming a new composition of matter of A (e.g., GaAs) and B (e.g., AlAs or Ge) by directing a periodically pulsed molecular beam at a substrate. During a first part of each period an A-beam is directed at the substrate for a time effective to grow material A having a thickness of n monolayers and during a second part of each period directing a B-beam at the substrate for a time effective to grow material B having a thickness of m monolayers.

Critical Temperature: (GaAs)-(AlAs)

With the system as described above we first investigated layer roughening and inter-layer diffusion by depositing on a single substrate a plurality of $(GaAs)_n(AlAs)_m$ superlattices about 7000 to 9500 Angstroms thick separated from one another by GaAs marker layers about 1800 Angstroms thick. Each superlattice was grown however at a different substrate temperature. More specifically, we deposited a standard GaAs buffer layer on a (100) GaAs substrate and then deposited the following superlattices identified only by their (n,m) parameters: (1,1) at 610 degrees C.; (2,2) at 611 degrees C.; (4,4) at 611 degrees C.; eight (1,1) superlattices at respectively 602 degrees C., 590 degrees C., 581 degrees C., 571 degrees C., 561 degrees C., 551 degrees C., 538 degrees C. and 530 degrees C.; (3,3) at 560 degrees C.; (3,1) at 560 degrees C.; and (1,3) at 560 degrees C. In a similar fashion we fabricated superlattices at deposition temperatures ranging between 510 degrees C. and 630 degrees C. for $0.9 \leq n \leq 5$ and $0.9 \leq m \leq 4$.

For example, the effects of the substrate temperature on the growth kinetics of the MBE film were investigated for a monolayer structure with a $(GaAs)_1(AlAs)_1$ composition. The film stoichiometry (i.e., $n=m=1$) was kept constant to within $\pm 3\%$ for four deposition temperatures: 610° C., 602° C., 581° C. and 561° C. Intensity densitometer scans of the TED patterns for the four deposition temperatures studied differed from one another by the position and intensity of the superlattice satellite spots located in between the (200) and (400) excited Bragg reflections. For a critical deposition temperature of $T_c = 610°$ C. no superlattice spot was visible and the film displayed a TED pattern similar to that of an $Al_{0.5}Ga_{0.5}As$ random alloy. As the deposition temperature was decreased to 602° C., some ordering in the superlattice appeared and two weak, closely spaced superlattice spots were observed. For $T = 581°$ C. the spacing and intensity of the two satellites increased and finally for $T = 571°$ C., a single satellite, halfway between the (400) and (200) reflections, was seen. The presence of the satellite halfway between the main (h00) spots (for even h values) is characteristic of the $(GaAs)_1(AlAs)_1$ superlattice. Unfortunately, multiple scattering effects and saturation effects introduced in photographically recording the TED patterns prevents the use of the intensity ratios between the main spot and satellite spots to measure quantitatively the degree of ordering in the film deposited at 561° C. However, the dark field images of this film did indicate that over 50% of the film contained ordered domains with sizes of about 300–500 Angstroms.

The existence of a critical temperature $T_c$ above which the superlattice is not formed may have several origins. If island growth is dominant at temperatures $T \geq T_c$, a high density of small islands will result on the growth surface which would then exhibit roughening. The superlattice will give a TED pattern similar to a random alloy with composition $Ga_{0.5}Al_{0.5}As$. This roughening of the growth interface could correspond to the original suggestion of Burton and Cabrera that singular stepless surfaces undergo a roughening transition at a temperature T which is marked by singularities in the structural and thermodynamic properties of the surface. Recent theoretical Monte Carlo simulations of crystal growth processes have also confirmed the existence of a transition temperature characteristic of a surface roughening during growth. It is also possible that for $T > T_c$ interdiffusion between the GaAs and AlAs layers becomes important; the resulting film would again exhibit the TED pattern of a random $Ga_{0.5}Al_{0.5}As$ alloy. However, we note that if interdiffusion at the growth interface were taking place, it would occur homogeneously throughout the superlattice. Thus, a uniform distribution of ordered and disordered domains would be present in the film. A dark field micrograph of a $(GaAs)_4(AlAs)_4$ superlattice deposited at $T = 610°$ C. showed that disordered domains were preferentially elongated along the growth direction and were randomly distributed throughout the film as would occur if random rough regions had been nucleated and grown over. Alternate monolayer superlattices grown at $T = 600°$ C. exhibit identical growth characteristics. Furthermore, diffusion experiments on MBE monolayer superlattices have indicated that the bulk diffusion coefficient, D, for Ga and Al is extremely small [for example, the $(GaAs)_1(AlAs)_1$ superlattice is unaffected by an annealing of 2 hours at $T = 650°$ C. in an As atmosphere]. Thus, the disordering of the superlattice is attributed to the surface roughening and the dominance of the island growth mode during the MBE growth when the substrate temperature is larger or equal to $T_c$.

The variations in superlattice periodicity shown for films grown at $T < T_c$ could possibly be accounted for by: (a) small fluctuations in the beam stoichiometry (although these were $\leq 3\%$ for these films during the deposition run) and (b) changes in the nucleation and growth kinetics of the islands. The errors involved in measuring both the variations in the beam stoichiometry and the superlattice periodicity do not permit one to distinguish unambiguously between these two possibilities. However, our results of similar growth kinetics studies on misoriented substrates [2–3 degrees off (100)] indicated that the superlattice periodicity is constant over a large temperature range $550 \leq T \leq 590°$ C. This would suggest that for singular (100) substrates the island nucleation kinetics are a sensitive function of the deposition temperature while growth on vicinal planes is controlled by the presence of a regular array of atomic steps. The TED patterns of the films grown at 570° C. and 560° C. supported the idea that a "layer growth" regime was dominant during growth.

Intensity densitometer scans of TED patterns were also investigated for a series of superlattice films grown with m>>n and m<<n and for various substrate temperatures. Superlattice films which were rich in AlAs [e.g., (n,m)=(1,3)] exhibited a critical temperature $T_c \approx 610°$ C. while for superlattices rich in GaAs [e.g., (n,m)=(3,1)], the critical temperature was larger than 630° C. The presence of satellite spots in $(GaAs)_{2.86}(AlAs)_{0.91}$ structures (nominally n=3, m=1) grown at 610° C. and 630° C. was taken as an indication that a substantial amount of the superlattice was ordered. Dark field images of these two structures formed with superlattice reflections indicated the presence of disordered domains. The TED patterns of $(GaAs)_{1.1}(AlAs)_{3.61}$ and $(GaAs)_{3.31}(AlAs)_{1.22}$ superlattices deposited at 560° C. exhibited sharp, well-defined satellites and therefore were ordered independent of the ratio m/n.

These results underline the strong dependence of $T_c$ on the film chemical composition. It also follows that surface roughening increases during the deposition of the AlAs layers. In fact, the surface smoothing effect during the deposition of the GaAs atomic layers has been used at the beginning of deposition whenever a structure of stacked alternating superlattices and marker layers was desired. Diffraction data indicated that the nucleation and growth of islands control the growth process of the AlAs layers deposited at $T \gtrsim 610°$ C., whereas these island kinetics do not appear to be a controlling factor for the GaAs layers at this temperature. The difference in the growth process of the GaAs and AlAs layers is not presently understood although the gettering of impurities by the highly reactive AlAs surfaces could explain the easy nucleation of islands on these surfaces. Finally, we note that for deposition temperatures near $T_c$, the interface roughness is proportional to the amount of disorder in the superlattice. For example, in a $(GaAs)_4(AlAs)_4$ superlattice deposited at 610° C., the interface roughness was often approximately equal to the dimension of the ordered domains in the direction orthogonal to the [100] growth axis.

In summary, the growth kinetics of $(GaAs)_n(AlAs)_m$ superlattices deposited on (100) GaAs substrates have shown that:

(a) The substrate temperature strongly influences the growth kinetics of the MBE films. The desired layer growth mode appears to dominate over the temperature range 560° C.$\leq T \leq$570° C. for m=n=1.

(b) There exists a critical substrate temperature, $T_c$, above which an ordered superlattice cannot be formed. For $(GaAs)_1(AlAs)_1$ superlattices, $T_c \approx 610°$ C. This transition temperature has been attributed to roughening of the growth surface.

(c) The film chemical composition strongly affects the value of $T_c$; furthermore, the value of $T_c$ increases in superlattices with n/m>1. Thus, for (n,m)=(3,1), $T_c \gtrsim 630°$ C. whereas for (n,m)=(1,3), $T_c \lesssim 610°$ C.

These results point out the importance of the deposition parameters on the quality of the interfaces in superlattice films deposited by MBE. It is probable that these interfaces also control the electronic properties of such structures and thus are of importance for the attainment of MBE superlattice type material suitable for device applications.

Example: (GaAs)-(AlAs)

We used (100) GaAs substrates held at 577 degrees C. to fabricate a number of other $(GaAs)_n(AlAs)_m$ monolayer superlattices. Shadows of the Ga and Al beams were produced by a clip over the substrate and yielded separate measurements of the total deposited GaAs, AlAs and composite thicknesses. Glancing incidence 3 keV electron diffraction allowed monitoring of the crystal surface structure during the growth. Under the above growth conditions, an excellent diffraction pattern with lines characteristic of high quality, smooth single crystal (100) layers with a (2×8) surface reconstruction was observed. Total thicknesses of 1 μm to 4 μm of material were deposited. During and after deposition, the sample surfaces remained smooth and featureless. A number of specimens with different stacking sequences and thicknesses were made, three of which are characterized in Table I.

| Superlattice Sample | n | m | n + m |
|---|---|---|---|
| A1 | 6.13 ± .29 | 3.37 ± .41 | 10.0 ± 0.4 |
| A2 | 8.04 ± .38 | 1.15 ± .14 | 10.0 ± 0.4 |
| B | 1.22 ± .08 | 0.98 ± .08 | 2.25 ± .06 |
| C | 1.00 ± 0.1 | 1.00 ± 0.1 | 2.00 ± .06 |

Figure 2:
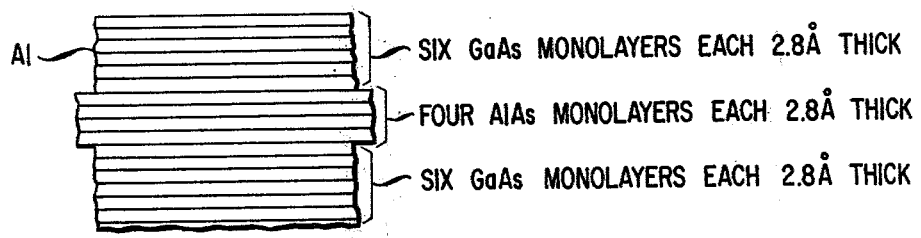
FIG. 2 is an expanded view of a portion of the $(GaAs)_6(AlAs)_4$ superlattice A1 of FIG. 1.
Figure 3:
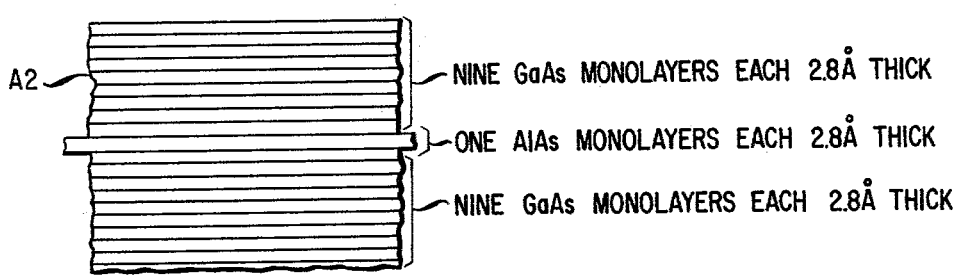
FIG. 3 is an expanded view of a portion of the $(GaAs)_9(AlAs)_1$ superlattice A2 of FIG. 1.

As shown in FIGS. 1–3, sample A comprised a 1.3 μm thick central superlattice A2 of nominally $(GaAs)_9(AlAs)_1$ bounded on either side by two 1.3 μm thick cladding superlattices A1 of nominally $(GaAs)_6(AlAs)_4$. The actual measured values of m and n are given in Table I. This structure could be utilized as an optical waveguide analogous to a conventional DH configuration of random alloys of the same average composition; namely, a $Ga_{0.9}Al_{0.1}As$ core bounded by $Ga_{0.6}Al_{0.4}As$ cladding.

Sample B, on the other hand, comprised 3.6 μm of epitaxial growth with a deposition sequence of 1.22±0.08 monolayers GaAs-0.98±0.08 monolayers AlAs for a total of 6000 periods. Sample C was analogous to sample B but m and n were closer to unity.

As before, TEM was used to investigate the resulting material and test for the achievement of the monolayer structure. Because of the various possible growth modes discussed previously, the programmed superlattice structure (i.e., that intended by the shutter sequencing) may not be formed in the deposited epitaxial film depending on the growth temperature and the particular values of (n,m). The actual structure deposited was determined by transmission electron diffraction (TED) of the same area of the film as that used to measure the superlattice periodicity $\lambda_p$. For films deposited on (100) GaAs substrates, however, the TED patterns showed satellite spots which were characteristic of the atomic order of the superlattice with periodicity $\lambda_p = (m+n)d_{(200)}$ where $d_{(200)}$ is the interatomic distance along the growth direction. The superlattice satellites were most easily imaged when the film was oriented to excite the (200) or (400) Bragg reflections. The sum (m+n) is then given by $(m+n) = R_{(200)}/r_s$ where $R_{(200)}$ and $r_s$ are respectively the distance of the (200) Bragg spots and the satellite spot from the transmitted beam spot. Values of (m+n) measured by this method were obtained with an accuracy of about 1%. Thus, the TED pattern provided a means of verifying whether the superlattice period in the film corresponded to that programmed by the shutter opening and closing sequence.

The monolayer superlattice samples were prepared for TEM examination to optimize the diffraction effects between the electron beam and the superlattice. This condition was achieved when the incident electron beam is parallel to the multilayer interfaces. The well-known "cross-section" technique was used to realize the necessary configuration. The samples were cleaved along (011) or (0$\bar{1}$1) planes and thinned by mechanical polishing and ion milling with 5 keV Ar$^+$ ions to a thickness of about 1 $\mu$m. The specimens were examined under high resolution imaging conditions in microscopes working both at 100 keV and 200 keV accelerating voltages. Both diffraction patterns and lattice imaging modes were utilized to examine the structures.

When the samples were tilted in the TEM so that a (200) or (400) 2-beam diffraction condition was satisfied, satellite diffraction spots characteristic of the new superlattice periodicities were observed on each side of the transmitted and diffracted beams, in addition to the full diffraction pattern of fundamental spots of the three-dimensional crystal structure. The continuous long range ordering in the growth direction was also confirmed from (i) the absence of microdomains in dark field images formed using one of the strong superlattice reflections and (ii) the absence of any satellite splitting characterizing possible partially ordered regions except in sample C. From densitometer intensity scans of the diffraction patterns for samples A2 and B, well-resolved satellites characteristic of one-dimensional superlattice structure were observed for both samples, providing direct evidence of achievement of the layered structures. Nine strong satellites of sample region A2 resulted from the thin layer of 1.15±0.14 monolayers of AlAs in each deposition cycle. The satellite pattern for region A1 with intensities peaked near the (000), (200), and (400) reflections was produced by 3.37±0.41 monolayers of AlAs each cycle period. Two satellites were observed midway between the (200) and (400) spots for sample B. The splitting between these satellites is proportional to the small deviation of the 1.22±0.08 GaAs monolayers-0.98±0.08 AlAs monolayer deposition sequence from an exact (GaAs)$_1$(AlAs)$_1$ monolayer superlattice, which would have produced a single satellite midway between the (200) and (400) spots. Values of (m+n) for the three samples are given in Table I and are seen to be consistent with, but more precise than values determined optically from the clip shadows.

It was found for all samples that structure factors calculated from the measured depositional periodicity and the average deposited layer compositions yielded relative intensities in agreement with observation. Structure factors of hypothetical samples with partially intermixed layers, as might be produced by interdiffusion between layers or rough growth, yielded poorer agreement with the observed patterns, with intensities changing roughly as the square of the long range order parameter. Based on diffraction and sub-lattice fringes we can conclude that the long range order parameters in the growth direction exceed 0.3 relative to a perfect structure, and that we have indeed produced long range ordered monolayer superlattices. An order parameter of 0.3 means that about 65% of the Ga atoms were on Ga sites and, therefore, that 35% of the Ga atoms were on Al sites (i.e., 0.65−0.35=0.3).

OPTICAL PROPERTIES

The optical properties of a range of monolayer structures have also been investigated. (GaAs)$_n$(AlAs)$_m$ superlattice structures with $n \approx m \approx 1$ exhibited an indirect absorption edge near 2 eV at 2K with an accompanying emission band which peaked some 15 meV below the absorption edge. In this composition range the indirect absorption edge appeared also to represent the minimum band gap of these new materials, and was near the random alloy value. The energy of the edge was weakly dependent upon $n \approx m$ in the range at least up to n=4; i.e., for (GaAs)$_1$(AlAs)$_1$ up to (GaAs)$_4$(AlAs)$_4$. Measured shifts were consistent with square well energy level calculations.

Samples with $n \geq 2 > m = 1$, (i.e., superlattices with more Ga than Al per period) showed a well-resolved, intense free-exciton absorption peak and an abrupt, strong interband absorption edge. Specifically, composition A2 (FIGS. 1 and 3) exhibited an exciton peak at 1.675 eV with a maximum absorption coefficient, $\alpha = 1.2 \times 10^4$ cm$^{-1}$. Evidently the minimum band gap is direct in this superlattice, as it is in random Al$_x$Ga$_{1-x}$As of the same average composition.

Luminescence from the edge of these structures (i.e., emitted in the plane of the layers) was polarized, with small energy differences (~20 meV) and variable intensity differences for the electric vector in the plane ($\sigma$) or normal to the plane of the layers ($\pi$). Polarization ratios as large as $I_\sigma/I_\pi \sim 10$ have been determined, demonstrating that the electronic properties at the band edge are anisotropic—a property that is impressed upon the structure by the superlattice and that cannot arise in a random Al$_x$Ga$_{1-x}$As alloy.

Finally, 200 Angstrom GaAs quantum wells with (GaAs)$_n$(AlAs)$_m$ monolayer superlattice barriers rather than Al$_x$Ga$_{1-x}$As barriers show sharp quantum bound state optical absorption spectra. Thus, the monolayer superlattice is also capable of confining electrons and holes, as is desired in many heterostructure devices. Optical waveguiding in monolayer structures has also been observed in structures of the type shown in FIG. 1. Using an incoherent light source from a monochromator, transmission at 1.1 eV to 1.4 eV through superlattice A2 was measured. In one sample we found $\alpha \approx 2$ cm$^{-1}$ and a fairly sharp absorption edge without much band-tailing. In another sample like A2, $\alpha$ ranged from 1 cm$^{-1}$ at 1.1 eV to as high as 4 cm$^{-1}$ at 1.4 eV.

EXAMPLE: (AlGaAs)-(Ge)

We have also used the same technique to deposit sequences of (GaAs)$_n$(Ge$_2$)$_m$ with (n,m) equal to (1,1) and (1,2) on (100) GaAs substrates. Other substrates are also suitable (e.g., Ge, AlGaAs). Again three ovens were used but this time Ga, As and Ge were the source materials. Of course, subsequent process steps (e.g., long duration or high temperature annealing) which might cause significant interdiffusion of the GaAs and Ge species should be avoided in order to maintain the integrity of the deposited structure.

In such (GaAs)$_n$(Ge$_2$)$_m$ structures we found that at growth temperatures at or above 590° C., a new phase (eutectic or spinodal) appeared in the films which prevented the formation of any superlattice for n and m $\leq$ 2. Although the layers grew epitaxially, misfit dislocations were present to accommodate the large lattice misfit at the growth temperature.

On the other hand, for $n,m \leq 2$ and at a growth temperature of 400° C., which is below the 450 degrees C. lower limit taught in the prior art for MBE growth of GaAs, the films also contained the new phase but, in addition, evidenced columnar growth, (viz. FIG. 4B) which prevented the growth of superlattices. However, these films grew epitaxially and contained few defects and, therefore, represented new synthetic materials having optoelectronic properties intermediate those of GaAs and Ge. Indeed, the amount of Ge incorporated in the compositions far exceeded the miscibility (solubility) limit of Ge in GaAs. For example, optical absorption data showed that the GaAs-Ge structures had characteristics distinct from those of bulk GaAs and bulk Ge. More specifically, the optical absorption edge of the structures at 1.2 eV was between that of GaAs (1.4 eV) and Ge (0.7 eV).

An analogous system, $(Al_xGa_{1-x}As)_n(Ge_2)_m$ was also studied for $x=0.5$. Results indicated the same phenomena (new phase, columnar growth) for $n,m \leq 3$ at growth temperatures of 500°–575° C. as depicted in FIG. 4B. More specifically, m2 monolayers of $Ge_2$ were deposited on a GaAs substrate (and buffer layer, not shown), but the subsequent attempt to deposit n2 monolayers of AlGaAs resulted in the growth of islands I1, I2, I3 rather than a uniform layer. The amount of material in the islands, however, was equivalent to that contained in n2 monolayers. Then, m2 monolayers of $Ge_2$ were deposited but did not completely fill in the gaps between the AlGaAs islands. As a consequence, the tops of the islands continued to act as nucleation sites for subsequently deposited AlGaAs. Because the islands were continuous extensions of one another, columns of AlGaAs resulted as shown in FIG. 4B.

Figure 4A:
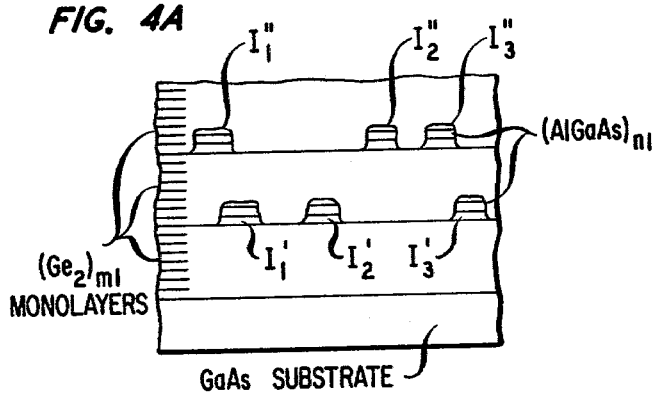
FIG. 4A is a schematic showing superlattice-like growth of $(Al_xGa_{1-x}As)_n(Ge_2)_m$, $n \lesssim 2$, $m \gtrsim 5$.
Figure 4B:
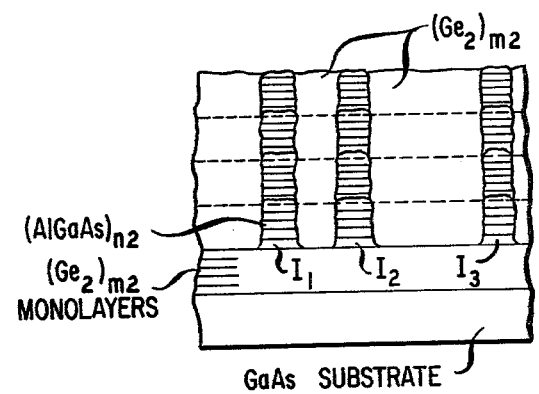
FIG. 4B is a schematic showing non-superlattice, columnar growth of $(Al_xGa_{1-x}As)_n(Ge_2)_m$, $n \lesssim 2$, $m \lesssim 2$.

In contrast, for $n=1$, $m=5$ or 10 and a growth temperature of 605° C., a quasi-superlattice as shown in FIG. 4A was fabricated. In this case, islands I1', I2', I3' of AlGaAs again formed when $n1=1$ monolayer of AlGaAs was deposited on $Ge_2$. But, subsequent deposition of $m1=5$ or 10 monolayers of $Ge_2$ completely covered the AlGaAs islands forming fresh, entirely Ge growth surfaces for subsequent deposition of AlGaAs. Then, another deposition of n1 monolayers of AlGaAs formed another set of islands I1'', I2'', and 13''. As before, the quantity of material in each group of islands (I1'+I2'+I3') and (I1''+I2''+I3'') was equivalent to that in n1 monolayers of AlGaAs. This quasi-superlattice showed no evidence of a new phase and no evidence of columnar growth. Epitaxial growth was good and relatively defect free.

Similar results were achieved with $(AlAs)_n(Ge_2)_m$ systems. Quasi-superlattices were grown at a temperature of 450° C. for $n,m \geq 10$, but the films contained $10^8$–$10^9 cm^{-2}$ of microtwins. For $m=n=1$ and growth temperatures of 500° C. and 575° C. the films exhibited columnar growth but no new phase was observed.

Figure 4C:
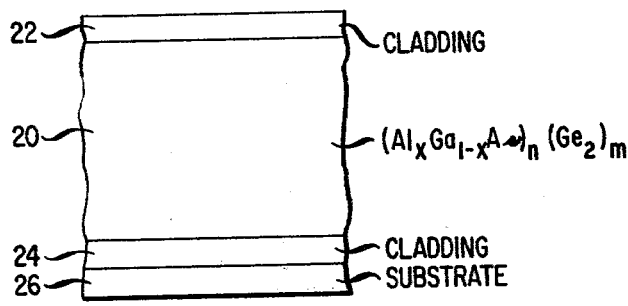
FIG. 4C is a schematic of a DH laser in which the active region is a $(GaAs)_1(Ge_2)_1$ monolayer superlattice in accordance with another embodiment of our invention.

Note that the absorption edge of the $Al_xGa_{1-x}As$-Ge structures can be made to match very closely the transmission window at about 1.0–1.1 μm of silica optical fibers. Consequently, in one important application shown in FIG. 4C these structures could form the active region 20 of a DH laser used to supply 1 μm radiation to silica fibers. The cladding layers 22 and 24, however, need not be superlattices. Rather they can simply comprise any semiconductor material having a lower refractive index than region 20 and which can be readily fabricated and doped. A suitable cladding is $Al_yGa_{1-y}As$ ($0 \leq y \leq 1$; $y > x$). Since present experimental evidence suggests that the AlGaAs-Ge structures inherently grow as n-type material, one logical configuration is to make the substrate 26 and cladding 24 n-type and the cladding 22 p-type. Other configurations including reversal of conductivity types are also possible, of course.

X-RAY REFLECTOR

Figure 5:
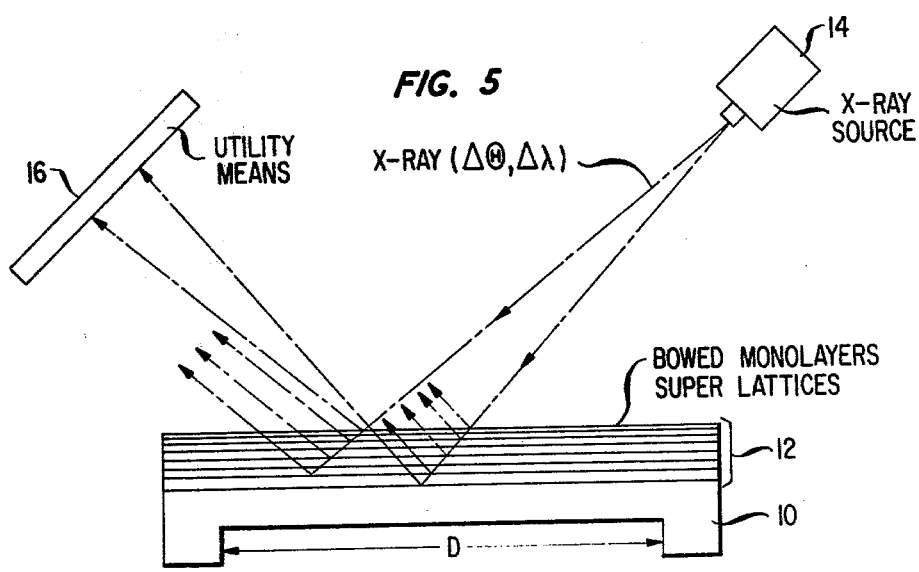
FIG. 5 is a schematic of an x-ray reflector using a monolayer superlattice in accordance with still another embodiment of our invention.

The foregoing monolayer superlattices, as well as those fabricated from materials yet untried, can be used to form a broad band x-ray reflector of the type shown in FIG. 5. More specifically, on a substrate 10 there is grown a plurality of superlattices 12 in which the superlattice periodicity varies in a prescribed fashion. The manner in which the periodicity varies is determined by the necessity to satisfy the Bragg condition $\lambda = 2d \sin \theta$ for a broadband, divergent x-ray source 14 so that the x-rays in a range of wavelengths will be reflected to utilization means 16. Thus, if source 14 emits a range of wavelengths $\Delta\lambda$, then for a given angle of incidence $\theta$, a range of thicknesses $\Delta d$ each on the order of atomic dimensions (i.e., monolayers) is needed to simultaneously satisfy the Bragg condition for all frequency components. Each d corresponds to the periodicity of a superlattice. The divergence of the source 14, characterized by radiation in a range $\Delta\theta$ of incident angles, is compensated for by curving the monolayers of the superlattice. In one embodiment this is accomplished by cutting or otherwise forming a hole of diameter D in the bottom of substrate 10. In this configuration the layers bow downwardly in the central portions (not shown) away from source 14. The larger D is the more the monolayers will bend. That the monolayers bend is a direct result of the fact that the substrate (e.g., GaAs) and the superlattices [e.g., $(GaAs)_n(AlAs)_m$] have different lattice constants so that the monolayers are under strain. As long as that strain is not otherwise relieved (e.g., by misfit dislocations), the hole in the substrate will allow the strain to bend the monolayers.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular the $(GaAs)_n(AlAs)_m$ superlattice can be used to form the cladding layers of a DH junction laser in which the active region is either a random alloy of $Al_xGa_{1-x}As$ or another GaAs-AlAs superlattice containing a greater n/m ratio. The basic configuration is that of FIG. 1. It is possible that such cladding layers will have higher thermal conductivity than random alloys of the same average composition.

Finally, many of the foregoing superlattices, quasi-superlattices and various compositions were also deposited on (110) GaAs substrates but in general the films exhibited more roughness than those deposited on (100) GaAs probably because of a greater tendency to grow in an island-growth mode rather than the layer-growth mode.

What is claimed is:

1. A periodic semiconductor structure comprising in each period:
   m contiguous monolayers of epitaxial $Ge_2$ having a major surface, and
   a plurality of islands of epitaxial $Al_xGa_{1-x}As$ ($0 \leq x \leq 1$) formed on said major surface, the quantity of material in said islands being equivalent to m contiguous monolayers of $Al_xGa_{1-x}As$ on said surface.

2. The structure of claim 1 wherein the islands in one period are physically separated from those in adjacent periods.

3. The structure of claim 2 wherein $x=0.5$, $n=1$ and $m=10$.

4. The structure of claim 2 wherein $x=1$ and $n=m=10$.

5. The structure of claim 1 wherein the islands of one period from a continuous extension of those of adjacent periods.

6. The structure of claim 5 wherein $x=0$ and $1 \leq m, n \leq 3$.

7. The structure of claim 5 wherein $x=0.5$ and $n, m \leq 3$.

8. The structure of claim 5 wherein $x=1$ and $m=n=1$.

9. In a double heterostructure, a semiconductor body comprising:
a semiconductor core region, adapted for the propagation of radiation therein,
a pair of cladding regions which bound said active region so that said radiation is guided therein, characterized in that:
said core region comprises a periodic structure including in each period n contiguous monolayers of epitaxial $Ge_2$ having a major surface, and a plurality of islands of epitaxial $Al_xGa_{1-x}As$ ($0 \leq x \leq 1$) formed on said major surface in a quantity equivalent to m contiguous monolayers of $Al_xGa_{1-x}As$ on said surface.

10. The body of claim 22 wherein said active region is adapted to emit radiation at a wavelength of about 1.0–1.1 μm.

11. The body of claim 22 wherein said cladding regions are fabricated from an $Al_yGa_{1-y}As$ random alloy, $0 \leq y \leq 1, y > x$.

12. In a double heterostructure, a semiconductor body comprising:
a semiconductor core region adapted for the propagation of radiation therein,
a pair of cladding regions which bound said core region so that said radiation is guided therein, characterized in that:
said cladding regions each comprise a superlattice of $(GaAs)_n(AlAs)_m$ where n and m are the number of contiguous monolayers of GaAs and AlAs, respectively, in each period of said superlattice.

13. The body of claim 12 wherein $n=6$ and $m=4$.

14. The body of claim 12 wherein said core region also comprises a superlattice of $(GaAs)_{n'}(AlAs)_{m'}$.

15. The body of claim 14 wherein $n'=9$ and $m'=1$.

* * * * *